(12) United States Patent
Rangel et al.

(10) Patent No.: US 11,994,223 B2
(45) Date of Patent: May 28, 2024

(54) BACKFLOW BLOCKING DEVICE FOR AXIAL FANS

(71) Applicant: Cisco Technology, Inc., San Jose, CA (US)

(72) Inventors: Adriana del Pilar Rangel, Campbell, CA (US); Quinn Bonard Gaumer, Durham, NC (US); Pinlin Zhuang, Pleasanton, CA (US)

(73) Assignee: Cisco Technology, Inc.

(*) Notice: Subject to any disclaimer, the term of this patent is extended or adjusted under 35 U.S.C. 154(b) by 241 days.

(21) Appl. No.: 17/533,828

(22) Filed: Nov. 23, 2021

(65) Prior Publication Data

US 2023/0160485 A1 May 25, 2023

(51) Int. Cl.
| | |
|---|---|
| *F16K 15/03* | (2006.01) |
| *B29C 63/04* | (2006.01) |
| *F04D 25/14* | (2006.01) |
| *F04D 29/52* | (2006.01) |
| *H05K 7/20* | (2006.01) |
| *F04D 29/56* | (2006.01) |

(52) U.S. Cl.
CPC .......... *F16K 15/035* (2013.01); *B29C 63/04* (2013.01); *F04D 25/14* (2013.01); *F04D 29/524* (2013.01); *H05K 7/20145* (2013.01); *F04D 29/563* (2013.01)

(58) Field of Classification Search
CPC ...... F04D 25/14; F04D 29/563; F04D 29/524; F04D 29/703; F16K 15/035; B29C 63/04
USPC .............. 454/353; 361/679.48, 679.01
See application file for complete search history.

(56) References Cited

U.S. PATENT DOCUMENTS

| | | | | |
|---|---|---|---|---|
| 3,780,640 | A * | 12/1973 | Fruth | F24F 13/075 |
| | | | | 454/315 |
| 6,135,875 | A * | 10/2000 | French | H02B 1/565 |
| | | | | 361/695 |
| 6,174,232 | B1 * | 1/2001 | Stoll | H05K 7/20172 |
| | | | | 361/695 |
| 7,040,345 | B2 * | 5/2006 | Koeger | F24F 13/1406 |
| | | | | 137/15.17 |
| 10,151,324 | B2 * | 12/2018 | Amin-Shahidi | F04D 25/0613 |

(Continued)

FOREIGN PATENT DOCUMENTS

DE 3720822 A1 * 5/1989

OTHER PUBLICATIONS

Holding, Trevor; Paper Thickness and Weight Explained, Action Press, p. 4 of 6 (Year: 2018).*

(Continued)

*Primary Examiner* — Steven S Anderson, II
*Assistant Examiner* — Frances F. Hamilton
(74) *Attorney, Agent, or Firm* — Merchant & Gould P.C.

(57) ABSTRACT

A backflow blocking apparatus for axial fans may be provided. The apparatus may comprise a sheet. The sheet may comprise a first section and a second section. The first section may comprise a plurality of flaps cut out of and retained by the first section of the sheet. The second section may comprise a guard structure. The apparatus may further comprise a fold about which the first section and the second section are folded on one another. The guard structure may inhibit the movement of the plurality of flaps in a direction toward the guard structure when the first section and the second section are folded on one another.

20 Claims, 5 Drawing Sheets

(56) References Cited

U.S. PATENT DOCUMENTS

| | | | |
|---|---|---|---|
| 11,533,827 B2* | 12/2022 | Belknap | H05K 7/20727 |
| 2002/0164943 A1* | 11/2002 | Misner | B60H 1/249 |
| | | | 454/164 |
| 2003/0091433 A1* | 5/2003 | Tam | F04D 25/14 |
| | | | 415/206 |
| 2006/0016482 A1 | 1/2006 | Berens et al. | |
| 2008/0112806 A1 | 5/2008 | Fan et al. | |
| 2009/0090006 A1* | 4/2009 | Gram | B29C 39/021 |
| | | | 264/294 |
| 2012/0145257 A1 | 6/2012 | Li | |
| 2012/0298665 A1* | 11/2012 | Foucault | B01L 3/50825 |
| | | | 220/254.5 |
| 2015/0211536 A1* | 7/2015 | Wei | F04D 25/14 |
| | | | 415/146 |
| 2016/0327062 A1* | 11/2016 | Amin-Shahidi | H05K 7/20736 |
| 2018/0376614 A1* | 12/2018 | Xiong | F04D 25/0613 |
| 2020/0154600 A1 | 5/2020 | Gupta et al. | |

OTHER PUBLICATIONS

Fuchs et al : Unidirectional Valves and methods for their use , EP-1406038, Apr. 7, 2004 (Year: 2004).*
Belknap et al: Binder reflux preventer, CN 114731769, Jul. 8, 2022 (Year: 2022).*

* cited by examiner

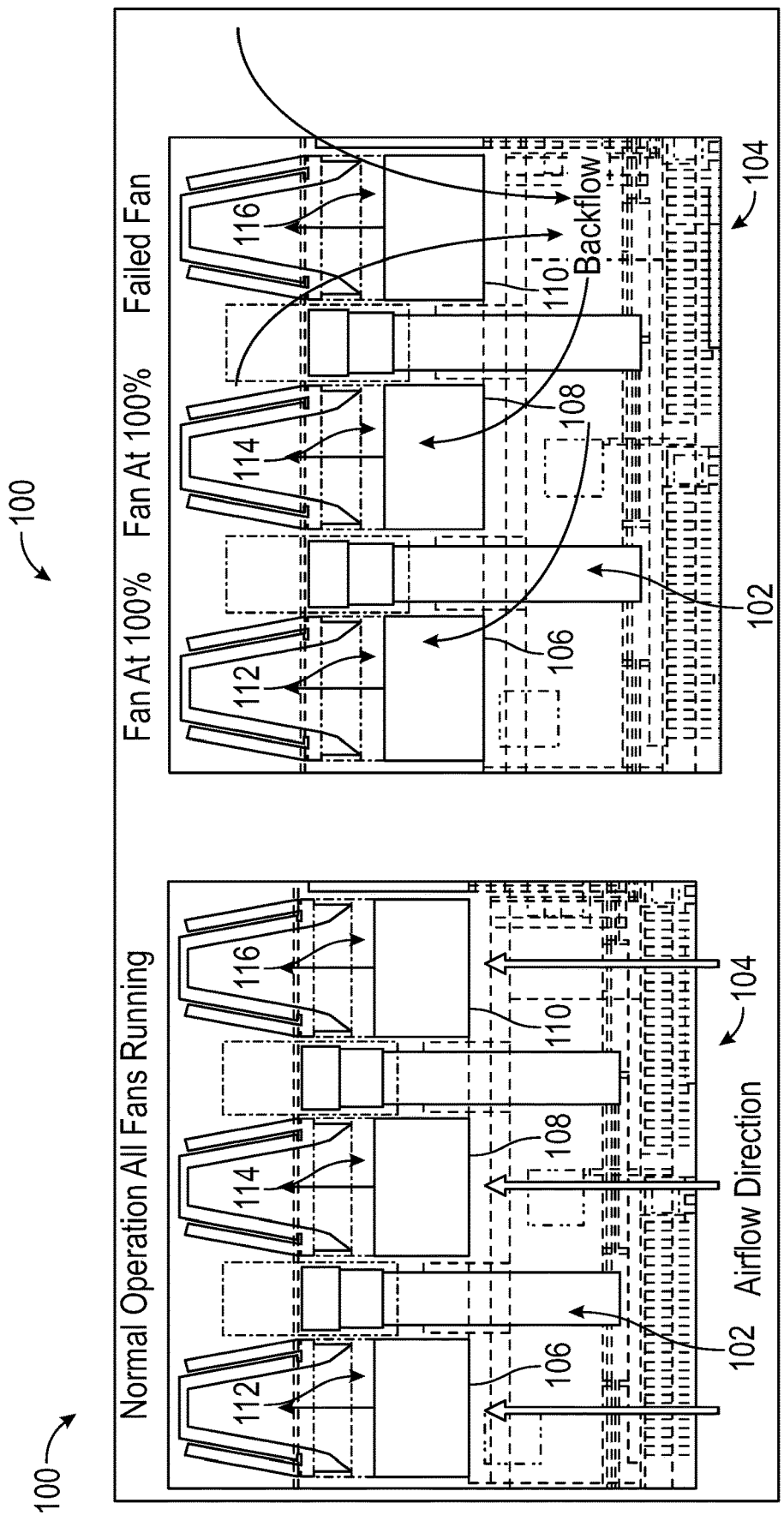

BACKFLOW BLOCKING DEVICE FOR AXIAL FANS

TECHNICAL FIELD

The present disclosure relates generally to blocking air backflow with a device on a fan.

BACKGROUND

There are a variety of rack mount enclosures currently available that draw external ambient air from the front of the enclosure, pass the air through the enclosure, and exhaust the air through the rear of the enclosure. As the moving air passes by operating circuits within the enclosure, the air carries away heat from the operating circuits thus maintaining the operating circuits within a normal operating temperature range for proper operation and reliability.

One conventional rack mount enclosure is 1 U (approximately 1.75 inches) in height and includes a fan assembly configured as a field replaceable unit (FRU). The fan assembly includes a fan frame and a row of four fans fastened to the fan frame. The fan frame includes a vertical face plate which faces outwardly from the front of the enclosure and two thumbscrews secured to the vertical face plate. The vertical face plate and the thumbscrews are offset from the profiles of the four fans in order to avoid obstructing the airflow generated by the fans. The thumbscrews thread into thumbscrew holes defined by the enclosure thus holding the frame to the enclosure to prevent the fan assembly from inadvertently escaping (e.g., due to vibration).

BRIEF DESCRIPTION OF THE FIGURES

The accompanying drawings, which are incorporated in and constitute a part of this disclosure, illustrate various embodiments of the present disclosure. In the drawings:

FIG. 1A and FIG. 1B show a top view of an electronic device;

DETAILED DESCRIPTION

Overview

Figure 2A:
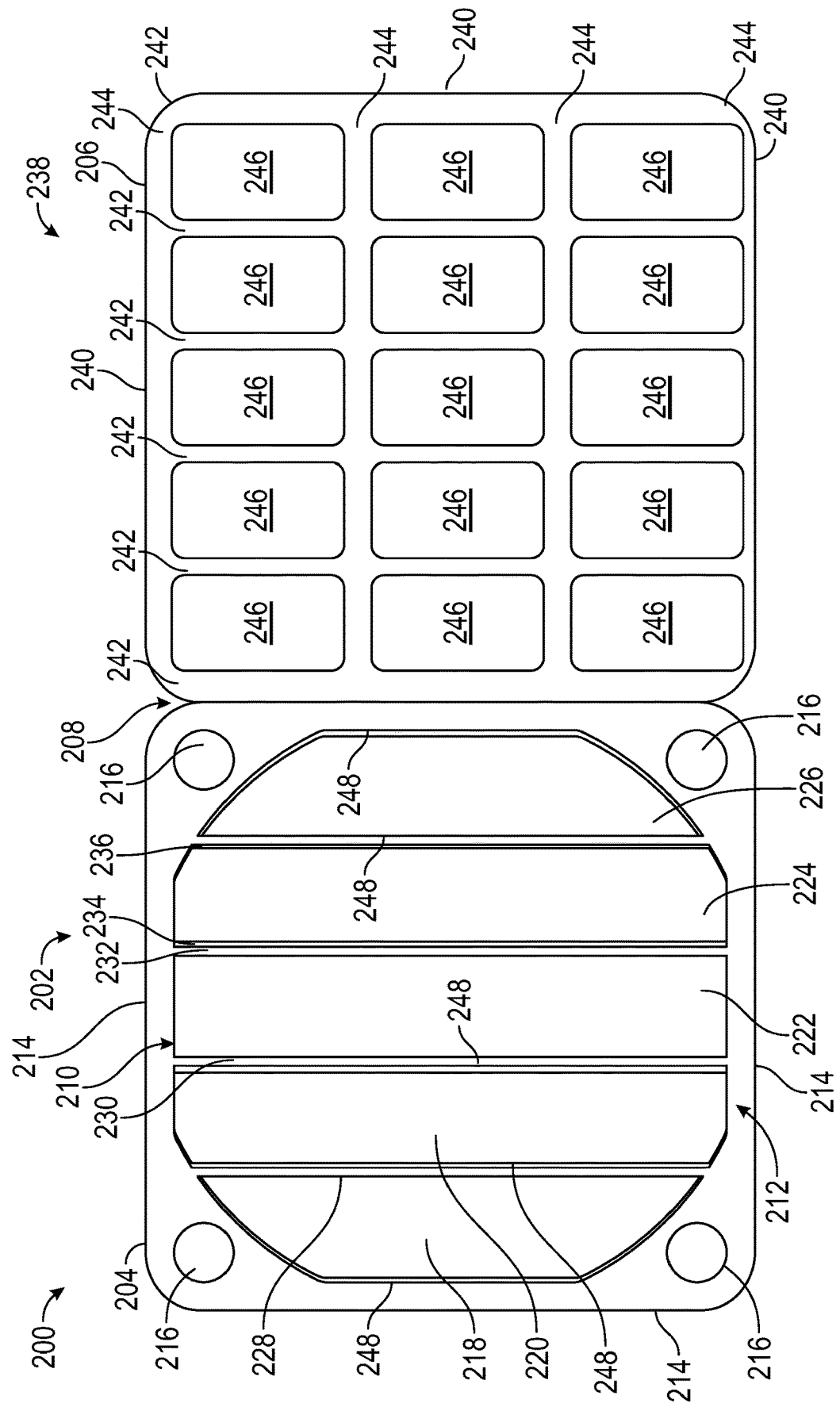
FIG. 2A, FIG. 2B, and FIG. 2C show various views of a backflow blocking apparatus.

A backflow blocking apparatus for axial fans may be provided. The apparatus may comprise a sheet. The sheet may comprise a first section and a second section. The first section may comprise a plurality of flaps cut out of and retained by the first section of the sheet. The second section may comprise a guard structure. The apparatus may further comprise a fold about which the first section and the second section are folded on one another. The guard structure may inhibit the movement of the plurality of flaps in a direction toward the guard structure when the first section and the second section are folded on one another.

Both the foregoing overview and the following example embodiments are examples and explanatory only and should not be considered to restrict the disclosure's scope, as described and claimed. Furthermore, features and/or variations may be provided in addition to those described. For example, embodiments of the disclosure may be directed to various feature combinations and sub-combinations described in the example embodiments.

EXAMPLE EMBODIMENTS

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Axial fans may be used to cool components in an electronic device. From time-to-time some of these fans may fail. When a fan fails and other fans are still operating, an airflow recirculation or backflow may occur. In other words, when axial fans are installed in parallel and one them fails, the other working fans pull air back through the failed fan creating a backflow. Airflow recirculation or backflow through a failed fan may be a significant problem that may result in higher or failing component temperatures. For example, the backflow through the failed fan may result in less airflow being pulled through the system and higher component temperatures.

Consistent with embodiments of the disclosure, blocking or partially blocking the air path when a fan fails may provide a cost-effective solution. For example, a backflow blocking apparatus made of a folded sheet may be attached to a fan exhaust. The backflow blocking apparatus may comprise, for example, a thin plastic part that may be cut in pieces to create flaps. The apparatus may then be installed at an axial fan's exhaust. When the fan is on and pulling airflow, the flaps may open to allow normal operation of the fans. Should the fan fail, the flaps may fall in place and block the airflow from flowing back through the failed fan in the opposite orientation. Embodiments of the disclosure may be cost effective because it may comprise one plastic part instead of a complex array of mechanical louvers.

FIG. 1A and FIG. 1B show a top view of an electronic device 100. As shown in FIG. 1A and FIG. 1B, electronic device 100 may comprise a plurality of fans 102 and electronic components 104. Plurality of fans 102 may comprise a first fan 106, a second fan 108, and a third fan 110. First fan 106 may comprise a first fan exhaust 112, second fan 108 may comprise a second fan exhaust 114, and third fan 110 may comprise a third fan exhaust 116.

Electronic device 100 may comprise a line card that may comprise any modular electronic component, field replaceable unit, service card, line card, fabric card, or other card, component, or module configured for insertion and removal from a network device. For example, electronic device 100 may comprise, but is not limited to, a fabric card, a service card, a combo card, a controller card, a processor card, a high density line card, and a high power line card. Notwithstanding electronic device 100 may comprise many types of field replaceable electronic units that may slide in or out of a chassis.

As shown in FIG. 1A, first fan 106, second fan 108, and third fan 110 may be running and may pull air over electronic components 104 in order to cool them. Plurality of fans 102 in FIG. 1A may be running at less than 100% and may be cooling electronic components 104 sufficiently. However, as shown in FIG. 1B, third fan 110 may fail. In response, a controller of first fan 106 and second fan 108 may cause first fan 106 and second fan 108 to run at 100% of their capacity.

When third fan 110 fails, and first fan 106 and second fan 108 are still operating, an airflow recirculation or backflow may occur. In other words, when plurality of fans 102 are installed in parallel and third fan 110 fails, first fan 106 and second fan 108 may pull air back through third fan 110 creating the backflow. The backflow through third fan 110 may be a significant problem that may result in higher or failing temperatures for electronic components 104.

Consistent with embodiments of the disclosure, a backflow blocking apparatus made of a folded sheet may be attached to respective exhausts (i.e., first fan exhaust 112, second fan exhaust 114, and third fan exhaust 116) on each of first fan 106, second fan 108, and third fan 110. The backflow blocking apparatus may comprise, for example, a thin plastic part that may be cut in pieces to create flaps. When first fan 106, second fan 108, and third fan 110 are on and pulling airflow, the flaps may open on each of their respective backflow blocking apparatuses to allow normal operation of the fans. However, when third fan 110 fails, the flaps on the backflow blocking apparatus on third fan exhaust 116 may fall in place and block the airflow from flowing back through failed third fan 110 in the opposite orientation.

Figure 2B:
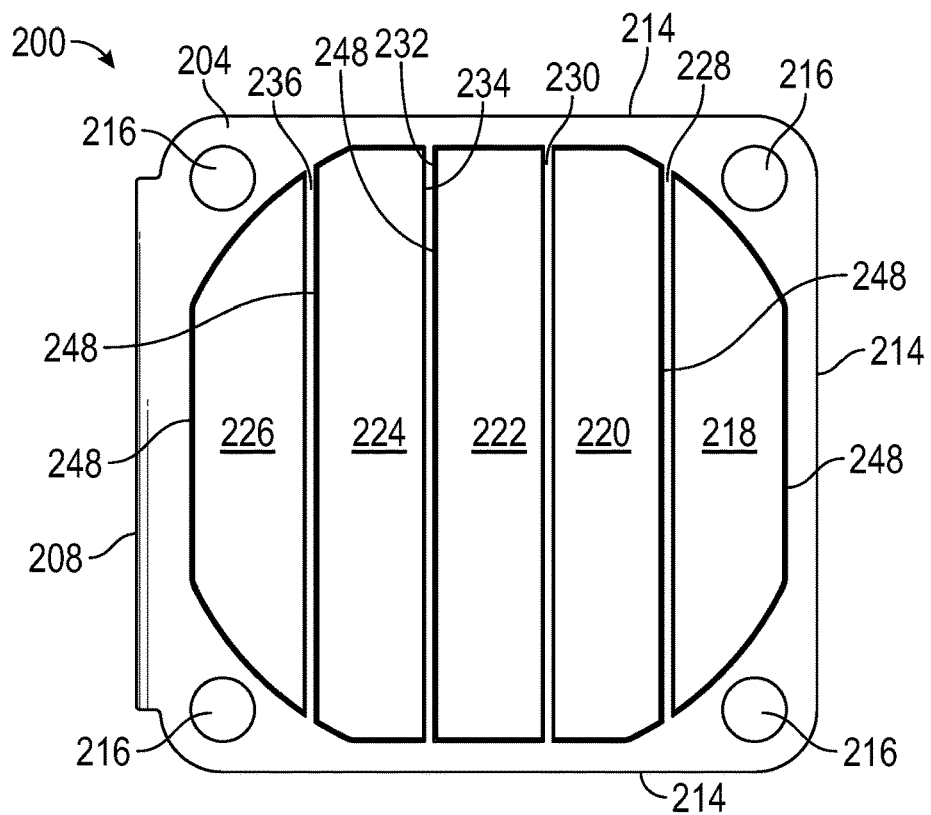
Figure 2C:
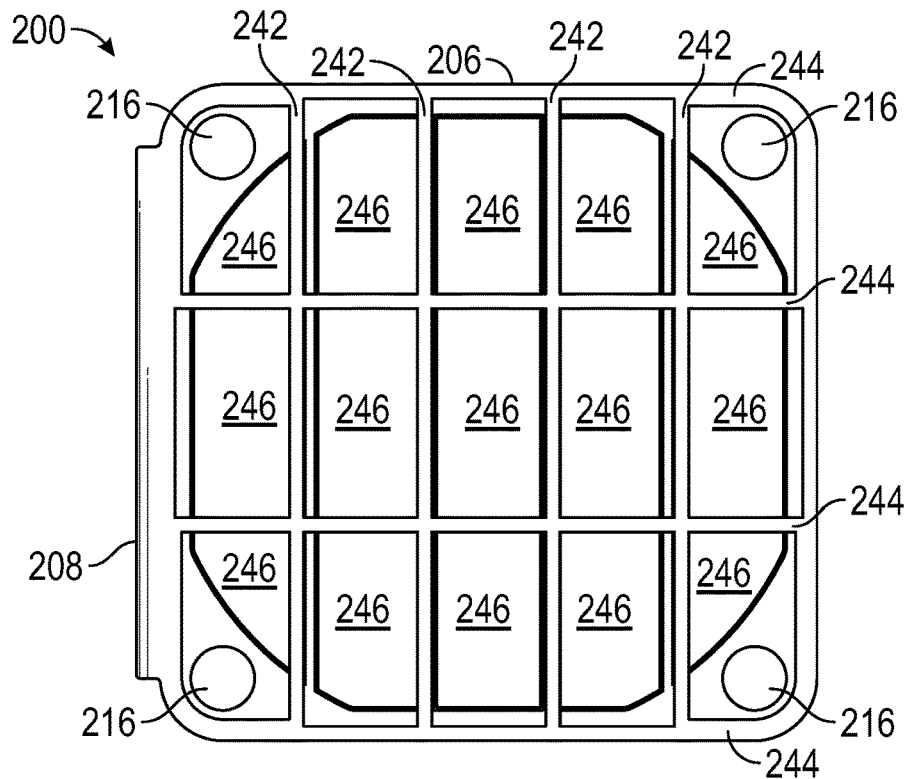

FIG. 2A, FIG. 2B, and FIG. 2C show various views of a backflow blocking apparatus 200. As shown in FIG. 2A, backflow blocking apparatus 200 may comprise a sheet 202 comprising a first section 204, a second section 206, and a fold 208.

First section 204 may comprise a plurality of flaps 210 a plurality of retention members 212, a plurality of first section sides 214, and a plurality of fasten openings 216. Plurality of flaps 210 may comprise a first flap 218, a second flap 220, a third flap 222, a fourth flap 224, and a fifth flap 226. While FIG. 2A shows five flaps, embodiments of the disclosure may comprise any number of flaps and is not limited to five. Plurality of retention members 212 may comprise a first retention member 228, a second retention member 230, a third retention member 232, a fourth retention member 234, and a fifth retention member 236.

Second section 206 may comprise a guard structure 238 and a plurality of second section sides 240. Guard structure 238 may comprise a first plurality of cross members 242, a second plurality of cross members 244, and a plurality of openings 246. First plurality of cross members 242 may be periductular to second plurality of cross members 244. Plurality of openings 246 may be any shape including, for example, rectangular. Plurality of openings 246 may be punched out of second section 206 of sheet 202.

Plurality of flaps 210 may be created by cutting a respective and associated plurality of slits 248 in first section 204. Plurality of flaps 210 may be retained by the respective and associated plurality of retention members 212. As shown in FIG. 2B and FIG. 2C, first section 204 and second section 206 may be folded on one another about fold 208. Guard structure 238 may inhibit the movement of plurality of flaps 210 in a direction toward guard structure 238 when first section 204 and second section 206 are folded on one another. Plurality of flaps 210 may be retained by the respective and associated plurality of retention members 212 when each of plurality of flaps 210 rotate between an open position and a closed position. Plurality of flaps may comprise any shape including, for example, triangular.

First section 204 of sheet 202 and second section 206 of sheet 202 may comprise a same size and a same shape. Furthermore, plurality of first section sides 214 of first section 204 may comprises a same length and plurality of second section sides 240 of second section 206 may have this same length. Plurality of fasten openings 216 may receive fasteners that may be used to attach backflow blocking apparatus 200 to an exhaust of an axial fan when first section 204 and second section 206 are folded on one another. The axial fan may comprise a 40 mm by 40 mm axial fan.

In some embodiments, sheet 202 may comprises a thickness of between 0.004 inches and 0.006 inches. In other embodiments, sheet 202 may comprises a thickness of between 0.0085 inches and 0.013 inches. Sheet 202 may comprise flame retardant polypropylene. For example, sheet 202 may comprise the GK flame retardant polypropylene sheet (e.g., GK-5 or GK-10) produced by ITW Electronic Components FORMEX of 425 North Gary Ave. Carol Stream, IL 60188.

Figure 3A:
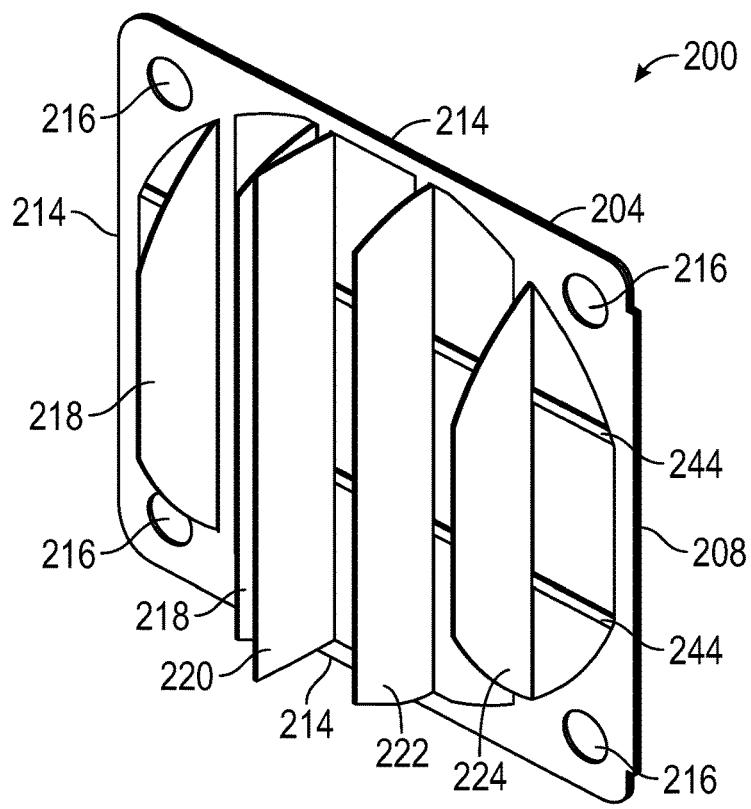
FIG. 3A and FIG. 3B show a backflow blocking apparatus.
Figure 3B:
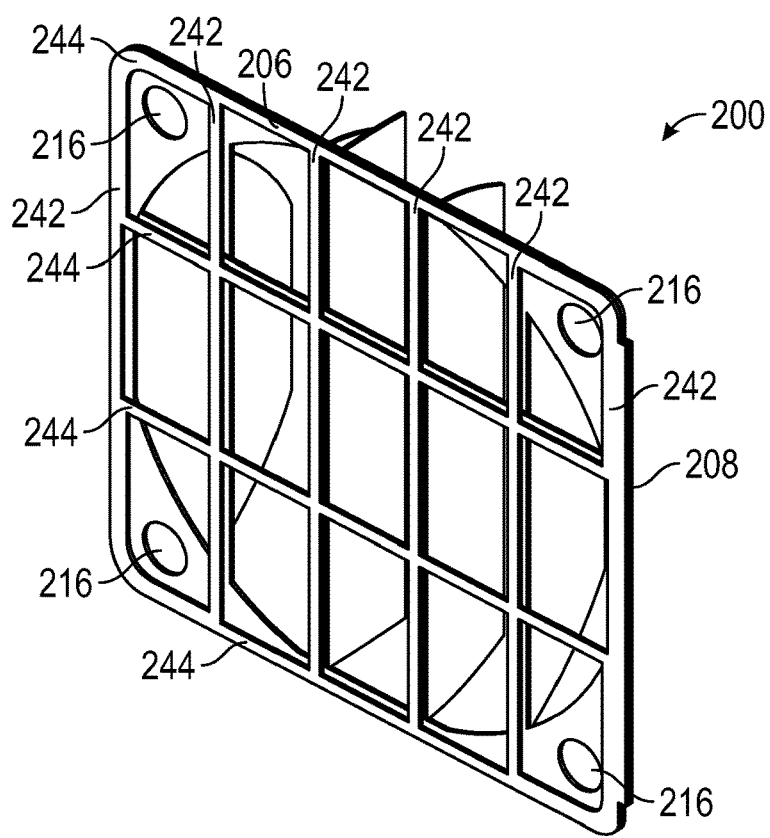

FIG. 3A and FIG. 3B show backflow blocking apparatus 200 with plurality of flaps 210 in an open position. As stated above, backflow blocking apparatus 200 may be installed at the exhaust of an axial fan. When the fan is on and pulling airflow, plurality of flaps 210 may open to allow normal operation of the fans. Should the fan fail, plurality of flaps 210 may fall in place and block the airflow from flowing back through the failed fan in the opposite orientation.

Figure 4:
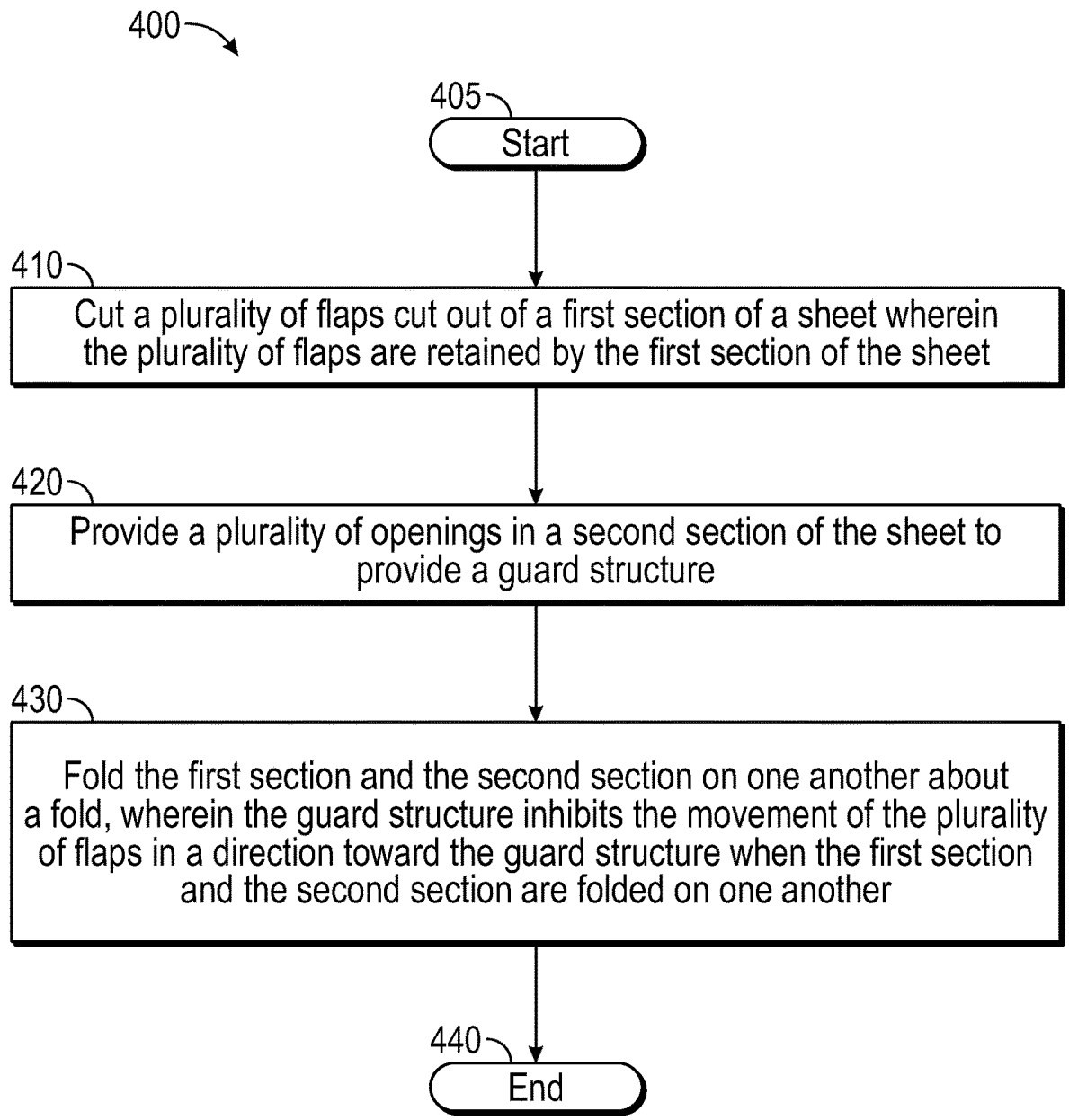
FIG. 4 is a flow chart setting forth the general stages involved in a method for providing a backflow blocking apparatus.

FIG. 4 is a flow chart setting forth the general stages involved in a method 400 consistent with an embodiment of the disclosure for providing a backflow blocking apparatus. Method 400 may be implemented using, for example, a machine capable of cutting, stamping, punching, and folding a sheet. Ways to implement the stages of method 400 will be described in greater detail below.

Method 400 may begin at starting block 405 and proceed to stage 410 where plurality of flaps 210 may be cut out of first section 204 of sheet 202. Plurality of flaps 210 may be retained by first section 204 of sheet 202. For example, plurality of flaps 210 may be created by cutting a respective and associated plurality of slits 248 in first section 204. Plurality of flaps 210 may be retained by first section 204 using the respective and associated plurality of retention members 212.

From stage 410, where plurality of flaps 210 are cut out of first section 204 of sheet 202, method 400 may advance to stage 420 where plurality of openings 246 may be provided in second section 206 of sheet 202 to provide guard structure 238. For example, plurality of openings 246 may be provided in such a way as to create first plurality of cross members 242 and second plurality of cross members 244. First plurality of cross members 242 may be periductular to second plurality of cross members 244. Plurality of openings 246 may be any shape including, for example, rectangular. Plurality of openings 246 may be punched out of second section 206 of sheet 202.

Once plurality of openings 246 are provided in second section 206 of sheet 202 to provide guard structure 238 in stage 420, method 400 may continue to stage 430 where first section 204 and second section 206 may be folded on one another about fold 208. For example, guard structure 238 may inhibit the movement of plurality of flaps 210 in a direction toward guard structure 238 when first section 204 and second section 206 are folded on one another. Once first section 204 and second section 206 may be folded on one another about fold 208 in stage 430, method 400 may then end at stage 440.

Embodiments of the disclosure may provide a backflow blocking apparatus. The apparatus may comprise a first section of a sheet, the first section comprising a plurality of flaps cut out of and retained by the first section of the sheet; a second section of the sheet, the second section comprising a guard structure; and a fold about which the first section and the second section are folded on one another, wherein the guard structure inhibits the movement of the plurality of flaps in a direction toward the guard structure when the first section and the second section are folded on one another. The first section of the sheet and the second section of the sheet may comprise a same size. The first section of the sheet and the second section of the sheet may comprise a same shape. The first section of the sheet may comprise a plurality of first section sides having a same length and the second section of the sheet may comprise a plurality of second section sides having the same length. The first section of the sheet may comprise a plurality of fasten openings. Each of the plurality of flaps may comprise a corresponding plurality of retention members about which each of the plurality of flaps rotates when each of the plurality of flaps rotate from an open and a closed position. Each of the plurality of flaps may be triangular. The guard structure may comprise a first plurality of cross members and a second plurality of cross members. The first plurality of cross members may be periductular to the second plurality of cross members. The guard structure may comprise a plurality of openings made in the second section of the sheet. The plurality of openings may be rectangular. The apparatus may be mounted on a 40 mm by 40 mm fan. The sheet may comprise a thickness of between 0.004 inches and 0.006 inches. The sheet may comprise a thickness of between 0.0085 inches and 0.013 inches. The sheet may comprise flame retardant polypropylene.

Embodiments of the disclosure may provide a backflow blocking apparatus. The apparatus may comprise a first section of a sheet, the first section comprising a plurality of flaps cut out of and retained by the first section of the sheet wherein each of the plurality of flaps comprises a corresponding retention member about which each of the plurality of flaps are configured to rotate; and a second section of the sheet, the second section comprising a guard structure wherein the guard structure comprises a first plurality of cross members and a second plurality of cross members, wherein the first plurality of cross members are periductular to the second plurality of cross members. The first section of the sheet may comprise a plurality of fasten openings.

Embodiments of the disclosure may comprise a method for providing a backflow blocking apparatus. The method may comprise: cutting a plurality of flaps cut out of a first section of a sheet wherein the plurality of flaps are retained by the first section of the sheet; providing a plurality of openings in a second section of the sheet to provide a guard structure; and folding the first section and the second section on one another about a fold, wherein the guard structure inhibits the movement of the plurality of flaps in a direction toward the guard structure when the first section and the second section are folded on one another. The method may further comprise providing a plurality of fasten openings in the first section of the sheet. The plurality of openings may be rectangular.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

The invention claimed is:
1. An apparatus comprising:
an electronic device comprising a plurality of modular electronic component and a plurality of fans, wherein the plurality of fans are configured to pull air over the plurality of modular electronic component, wherein each of the plurality of fans comprises a fan exhaust; and
a backflow blocking apparatus attached to the fan exhaust, wherein the backflow apparatus comprises:
a first section of a sheet, the first section comprising a plurality of flaps parallel to each other, wherein the plurality of flaps are cut out of and retained by the first section of the sheet;
a second section of the sheet, the second section comprising a guard structure; and
a fold about which the first section and the second section are folded on one another, wherein the guard structure comprises a first plurality of cross members and a second plurality of cross members, wherein the first plurality of cross members are perpendicular to the second plurality of cross members, and wherein the guard structure further comprises a plurality of openings between the first plurality of cross members and the second plurality of cross members.
2. The apparatus of claim 1, wherein the first section of the sheet and the second section of the sheet comprise a same size.
3. The apparatus of claim 1, wherein the first section of the sheet and the second section of the sheet comprise a same shape.
4. The apparatus of claim 1, wherein the first section of the sheet comprises a plurality of first section sides having a same length and the second section of the sheet comprises a plurality of second section sides having the same length.
5. The apparatus of claim 1, wherein the first section of the sheet comprises a plurality of fasten openings.
6. The apparatus of claim 1, wherein each of the plurality of flaps comprises a corresponding retention member about which each of the plurality of flaps rotates when each of the plurality of flaps rotate between an open position and a closed position.
7. The apparatus of claim 1, wherein the plurality of openings are rectangular.
8. The apparatus of claim 1, wherein each of the plurality of fans comprises a 40 mm by 40 mm fan.
9. The apparatus of claim 1, wherein the sheet comprises a thickness of between 0.004 inches and 0.006 inches.
10. The apparatus of claim 1, wherein the sheet comprises a thickness of between 0.0085 inches and 0.013 inches.
11. The apparatus of claim 1, wherein the sheet comprises flame retardant polypropylene.

12. An apparatus comprising:
an electronic device comprising a plurality of modular electronic component and a plurality of fans, wherein the plurality of fans are configured to pull air over the plurality of modular electronic component, wherein each of the plurality of fans comprises a fan exhaust; and
a backflow blocking apparatus attached to the fan exhaust, wherein the backflow apparatus comprises:
   a first section of a sheet, the first section comprising a plurality of flaps parallel to each other, wherein the plurality of flaps are cut out of and retained by the first section of the sheet, wherein each of the plurality of flaps comprises a corresponding retention member about which each of the plurality of flaps are configured to rotate; and
   a second section of the sheet, the second section comprising a guard structure, wherein the guard structure comprises a first plurality of cross members and a second plurality of cross members, wherein the first plurality of cross members are perpendicular to the second plurality of cross members, and wherein the guard structure further comprises a plurality of openings between the first plurality of cross members and the second plurality of cross members.

13. The apparatus of claim 12, wherein the first section of the sheet comprises a plurality of fasten openings.

14. The apparatus of claim 12, wherein the each of the plurality of fans comprises a 40 mm by 40 mm fan.

15. The apparatus of claim 12, wherein the plurality of openings are rectangular.

16. The apparatus of claim 12, wherein the sheet comprises a thickness of between 0.0085 inches and 0.013 inches.

17. The apparatus of claim 12, wherein the sheet comprises flame retardant polypropylene.

18. A method comprising:
forming a backflow blocking apparatus, wherein forming the backflow blocking apparatus comprises:
   cutting a plurality of flaps cut out of a first section of a sheet, wherein the plurality of flaps parallel to each other and are retained by the first section of the sheet;
   providing a plurality of openings between a first plurality of cross members and a second plurality of cross members in a second section of the sheet to provide a guard structure, wherein the first plurality of cross members are perpendicular to the second plurality of cross members; and
   folding the first section and the second section on one another about a fold, wherein the guard structure inhibits the movement of the plurality of flaps in a direction toward the guard structure when the first section and the second section are folded on one another; and
attaching the backflow blocking apparatus to a fan exhaust of an electronic device, the electronic device comprising a plurality of modular electronic components and a plurality of fans, wherein the plurality of fans are configured to pull air over the plurality of modular electronic components, and wherein each of the plurality of fans comprises the fan exhaust.

19. The method of claim 18, further comprises providing a plurality of fasten openings in the first section of the sheet.

20. The method of claim 18, wherein the plurality of openings are rectangular.

* * * * *